US012753493B2

(12) United States Patent
Sciarrillo et al.

(10) Patent No.: US 12,753,493 B2
(45) Date of Patent: Oct. 6, 2026

(54) METHOD OF MANUFACTURING A REDISTRIBUTION LAYER, REDISTRIBUTION LAYER, INTEGRATED CIRCUIT AND METHODS FOR ELECTRICALLY TESTING AND PROTECTING THE INTEGRATED CIRCUIT

(71) Applicant: STMicroelectronics S.r.l., Agrate Brianza (IT)

(72) Inventors: Samuele Sciarrillo, Usmate Velate (IT); Paolo Colpani, Agrate Brianza (IT)

(73) Assignee: STMicroelectronics S.r.l, Agrate Brianza (IT)

( * ) Notice: Subject to any disclaimer, the term of this patent is extended or adjusted under 35 U.S.C. 154(b) by 894 days.

(21) Appl. No.: 18/078,561

(22) Filed: Dec. 9, 2022

(65) Prior Publication Data

US 2023/0187389 A1 Jun. 15, 2023

(30) Foreign Application Priority Data

Dec. 14, 2021 (IT) ........................ 102021000031340

(51) Int. Cl.
*H10W 74/43* (2026.01)
*C23C 16/34* (2006.01)
(Continued)

(52) U.S. Cl.
CPC ............ *C23C 16/403* (2013.01); *C23C 16/34* (2013.01); *C23C 16/405* (2013.01);
(Continued)

(58) Field of Classification Search
CPC ....... C23C 16/303; C23C 16/34; C23C 16/40; C23C 16/403; C23C 16/405;
(Continued)

(56) References Cited

U.S. PATENT DOCUMENTS 11,195,809 B2 12/2021 Jahja et al.
2004/0241978 A1* 12/2004 Hsiung ............. H01L 21/76829 438/618

(Continued)

FOREIGN PATENT DOCUMENTS

CN 106469675 A 3/2017
CN 219513091 U 8/2023

OTHER PUBLICATIONS

IT Search Report and Written Opinion for priority application, IT 102021000031340, report dated Aug. 11, 2022, 8 pgs.

(Continued)

*Primary Examiner* — Brook Kebede
(74) *Attorney, Agent, or Firm* — Crowe & Dunlevy LLC

(57) ABSTRACT

To manufacture a redistribution layer for an integrated circuit, a first insulating layer is formed on a conductive interconnection layer of a wafer. A conductive body is then formed in electrical contact with the interconnection layer. The conductive body is then covered with an insulating region having an aperture that exposes a surface of the conductive body. The surface of the conductive body and the insulating region are then covered with an insulating protection layer having a thickness less than 100 nm. This insulating protection layer is configured to provide a protection against oxidation and/or corrosion of the conductive body.

18 Claims, 9 Drawing Sheets

(51) Int. Cl.

| | |
|---|---|
| ***C23C 16/40*** | (2006.01) |
| ***C23C 16/455*** | (2006.01) |
| ***C23C 16/50*** | (2006.01) |
| ***C23C 16/56*** | (2006.01) |
| ***G01R 31/28*** | (2006.01) |
| ***H10P 74/20*** | (2026.01) |
| ***H10W 74/10*** | (2026.01) |
| *H10W 70/05* | (2026.01) |
| *H10W 70/60* | (2026.01) |
| *H10W 70/66* | (2026.01) |

(52) U.S. Cl.
CPC ........ *C23C 16/45536* (2013.01); *C23C 16/50* (2013.01); *C23C 16/56* (2013.01); *G01R 31/2886* (2013.01); *H10P 74/207* (2026.01); *H10W 74/147* (2026.01); *H10W 74/43* (2026.01); *H10W 70/05* (2026.01); *H10W 70/60* (2026.01); *H10W 70/66* (2026.01)

(58) Field of Classification Search
CPC . C23C 16/455; C23C 16/45536; C23C 16/50; C23C 16/56; H01J 37/32; H01J 37/34; G01R 1/06; G01R 31/2886; G01R 31/28; G01R 31/2865; H10P 74/20; H10P 74/207; H10W 74/10; H10W 74/147; H10W 70/04; H10W 70/05; H10W 70/40; H10W 70/60; H10W 70/66; H10W 74/43
See application file for complete search history.

(56) References Cited

U.S. PATENT DOCUMENTS

| | | | |
|---|---|---|---|
| 2010/0155938 A1 | 6/2010 | Martinez et al. | |
| 2013/0228929 A1 | 9/2013 | Meinhold et al. | |
| 2015/0041985 A1 | 2/2015 | Hsieh et al. | |
| 2016/0379946 A1 | 12/2016 | Maekawa et al. | |
| 2018/0337051 A1* | 11/2018 | Chang | H10P 14/44 |
| 2019/0035728 A1 | 1/2019 | Venegoni et al. | |
| 2020/0006263 A1 | 1/2020 | Seidemann | |
| 2020/0105592 A1* | 4/2020 | Kuo | H01L 21/76844 |
| 2021/0193600 A1 | 6/2021 | Sridharan et al. | |
| 2022/0384371 A1* | 12/2022 | Sciarrillo | H01L 21/76834 |
| 2025/0273606 A1* | 8/2025 | Molgg | H01L 24/48 |

OTHER PUBLICATIONS

CN First Office Action and Search Report for counterpart CN Appl. No. 202211612528.5, report dated Jul. 23, 2025, 12 pgs.

* cited by examiner

METHOD OF MANUFACTURING A REDISTRIBUTION LAYER, REDISTRIBUTION LAYER, INTEGRATED CIRCUIT AND METHODS FOR ELECTRICALLY TESTING AND PROTECTING THE INTEGRATED CIRCUIT

PRIORITY CLAIM

This application claims the priority benefit of Italian Application for Patent No. 102021000031340, filed on Dec. 14, 2021, the content of which is hereby incorporated by reference in its entirety to the maximum extent allowable by law.

TECHNICAL FIELD

Embodiments here relate to a method of manufacturing a redistribution layer, a redistribution layer, an integrated circuit including the redistribution layer, a method for performing an electrical test of the integrated circuit, and a method of manufacturing an encapsulation structure for an integrated circuit.

BACKGROUND

As is known, integrated circuits (ICs) are composed of several overlapping layers made of semiconducting, insulating and conductive materials, typically defined by photolithography.

In a first phase (referred to in the art as front end of line (FEOL)) of a manufacturing process of an integrated circuit, individual devices such as, among others, transistors, diodes, resistors and capacitors, are patterned on the surface of a wafer.

In a second phase (referred to in the art as back end of line (BEOL)), the individual devices are interconnected by conductive metal lines. In particular, due to the complexity of modern IC layouts and high density of individual devices, the back end of line process comprises manufacturing several stacked metal layers, electrically insulated from one another by dielectric layers; with vias through the dielectric layers connecting any metal layer to the metal layers below and/or the one above.

In a third phase of the IC manufacturing process, belonging to the BEOL phase (which is of aid for the subsequent packaging processes), a redistribution layer (RDL) is patterned above the last metal interconnection layer. As is known, the redistribution layer is an extra metal layer used for routing the input/output pads to other locations on the die area, enabling simpler bonding (e.g., chip-to-chip bonding) during packaging manufacturing. Moreover, it is a power metal layer able to reduce the I/O access resistance. As last metal layer is also designed to fit the packaging process requirements.

FIG. 1 shows schematically a cross-section view of a portion of an integrated circuit (IC 1) according to the prior art including a pad, which is not explicitly depicted and is the region of IC 1 to be accessed through wire bonding or other contact solutions during the packaging process, and a redistribution layer (RDL) 2 that can be used to provide or acquire electrical signals to/from the pad. In particular, the IC 1 is represented in a system of spatial coordinates defined by three axes x, y, z, orthogonal to one another and the cross-section view is taken on an xz plane, defined by the x axis and the z axis. In the following, thicknesses, depths and heights are intended as measured along the z axis, and the meanings of "top" and "bottom", "above" and "below" are defined with reference to the direction of the z axis.

The IC 1 includes an interconnection layer 3, made of conductive material; the redistribution layer 2 includes a dielectric layer 4 extending above the interconnection layer 3 and a first passivation layer 6 extending above the dielectric layer 4. One or more further layers (not shown) may be present between the interconnection layer 3 and the dielectric layer 4 (e.g., in case layer 3 is made of Cu, a further SiN layer that protects the Cu metallization may be present between the interconnection layer 3 and the dielectric layer 4).

The redistribution layer 2 further comprises a barrier region 8, extending above a top surface of the first passivation layer 6 and across the whole depth of the first passivation layer 6 and of the dielectric layer 4, so as to be in contact with the interconnection layer 3.

The redistribution layer 2 further comprises a conductive region 10, extending on top of the barrier region 8. In particular, in a top view of the IC 1, the conductive region 10 extends within the area defined by the barrier region 8.

The barrier region 8 and the conductive region 10 form a conductive path from the interconnection layer 3 to the top surface of the first passivation layer 6.

The redistribution layer 2 further comprises a coating region 12, extending above the first passivation layer 6, around the conductive region 10 and the barrier region 8, and above the conductive region 10. The coating region 12 is in contact with the top surface of the first passivation layer 6, the conductive region 10 and the barrier region 8. Far from the pad, the coating region 12 fully covers the conductive region 10.

In other words, the coating region 12 completely covers the portions of the barrier region 8 and of the conductive region 10 extending above the top surface of the first passivation layer 6.

The redistribution layer 2 further comprises a second passivation layer, or photosensitive insulation layer, 16 (e.g., made of polyimide, polybenzoxazole (PBO), Epoxy, etc.), fully covering the coating region 12 far from the pad.

In particular, a convenient choice of conductive materials for the redistribution layer 2 is such that the conductive region 10 is made of copper (Cu), the coating region 12 is made of Silicon Nitride (SiN) with a thickness of about 0.5-1 μm. Other thicknesses may be chosen, according to the needs.

At the pad location, the conductive region 10 can be electrically contacted by wire bonding or, alternatively, by a conductive pillar (e.g., made of copper) grown on the conductive region 10 (e.g., by electroplating) through an opening 16*a* formed through the second passivation layer 16 and the coating layer 12, as shown in FIG. 2A.

With reference to FIG. 2A, features common to those of FIG. 1 are identified with same reference numerals. Here, the conductive region 10 is covered by the coating layer 12 of Silicon Nitride and by the passivation layer 16. The passivation layer 16 extends laterally to, and partially above, the conductive region 10 and the coating layer 12. In particular, the passivation layer 16 has a top opening 16*a* aimed at allowing access to the conductive region 10. The conductive region 10 can be electrically and physically accessed through such opening 16*a* after a step of etching away the portion of the coating layer 12 exposed through the opening 16*a*.

After removal of such portion of the coating layer 12, the conductive region 10 is electrically accessible to carry out electrical testing, in particular EWS ("Electrical Wafer Sorting") testing, functional testing, or other reliability tests. In order not to damage, or cause corrosion/oxidation of, the exposed part of the conductive region 10, the EWS test should be conducted at low temperatures (usually, ambient temperature or lower). This limits the number and typology of tests that can be carried out. Moreover, notwithstanding all care taken during these steps, the copper surface still undergoes the oxidation/corrosion phenomena before, during and/or after EWS tests, which generates a general degradation of the surface of the conductive region 10.

As shown in FIG. 2B, an undesired layer 23 (e.g., oxidized or corroded layer) is shown extending not only on the exposed copper surface, but also partially under the coating layer 12 (not shown in the figure).

FIG. 2C shows further manufacturing steps to package the IC 1, where a molding layer 24 is deposited within the opening 16*a* on the conductive region 10 (and at least partially on the undesired layer 23). The molding layer 24 is opened at the conductive region 10 (e.g., through a LASER drilling process) to reach the conductive region 10. The undesired layer 23 and optionally the conductive region 10 are also partially removed through the LASER drilling process, to expose the underlying copper surface on which an electroplating copper growth process can be carried out, to grow the thick copper pillar 25 that provides electrical access to the redistribution layer 2.

During the manufacturing, the steps between the front-end process (FIG. 2A) and the back-end process (FIG. 2C) involve several corrosion issues of the Cu material, which is not passivated. Such corrosion phenomena may also negatively evolve later during the working life of the device.

As shown in FIG. 2C, the not-removed portions of the molding layer 24 are coupled at least in part on a residual portion of the undesired layer 23. The presence of the undesired layer 23 under the protection layer 12 and/or under the molding layer 24 may cause an irreversible detachment of the protection layer 12 and/or molding layer 24 from the conductive region 10 during further manufacturing steps or, more dangerously, during the working life of the device thus manufactured. In fact, layer 23 is not of a stable material and can be prone to environmental contamination, such as Cl, $SO_4$ or Fluorine compounds, able to generate further corrosion of the RDL metallization.

The is accordingly a need in the art to provide a method of manufacturing a redistribution layer, a redistribution layer, an integrated circuit including the redistribution layer, a method for performing an electrical test of the integrated circuit, and a method of manufacturing an encapsulation structure for an integrated circuit, to overcome the problems previously illustrated.

SUMMARY

Embodiments herein concern: a method of manufacturing a redistribution layer, a redistribution layer, an integrated circuit including the redistribution layer, a method for performing an electrical test of the integrated circuit, and a method of manufacturing an encapsulation structure for an integrated circuit are provided.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

Figure 1:
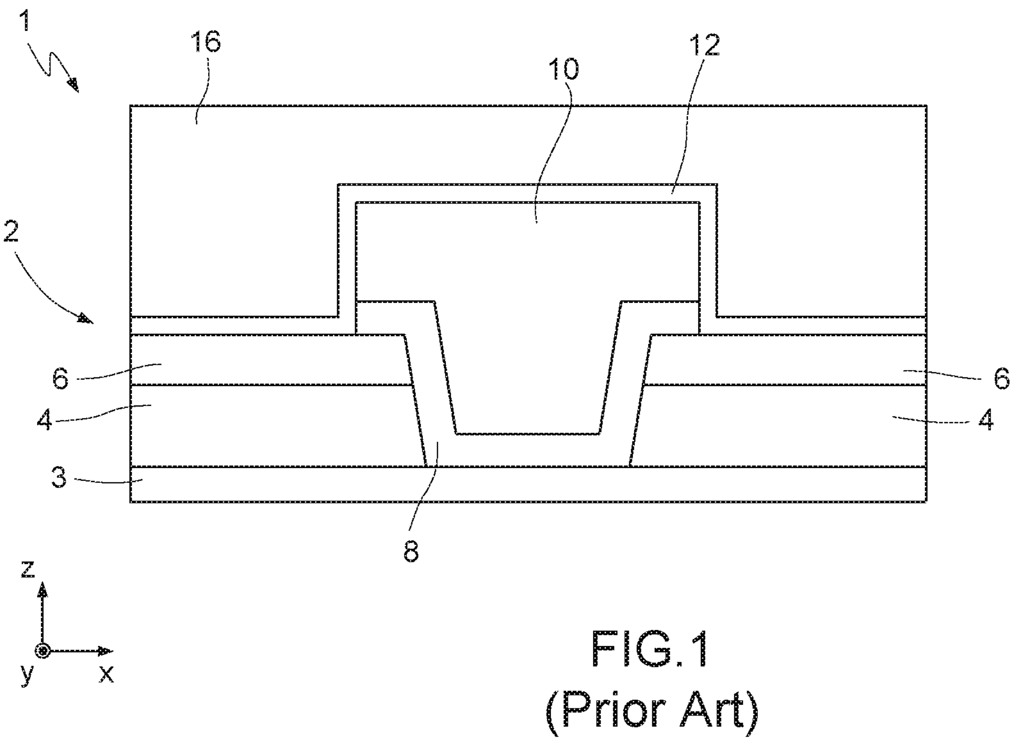
FIG.1 (Prior Art)
FIG. 1 is a cross-section view of a portion of an integrated circuit including a redistribution layer, according to the known art.
Figure 2A:
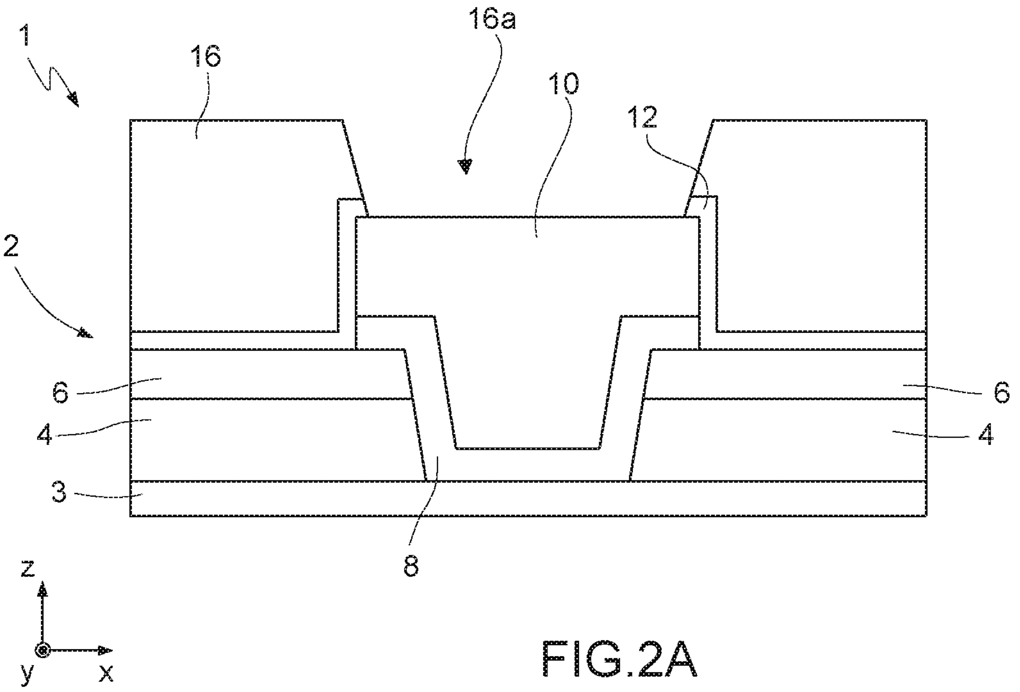
FIG.2A (Prior Art)
FIGS. 2A-2C show manufacturing steps of the redistribution layer of FIG. 1, according to the known art.
Figure 2B:
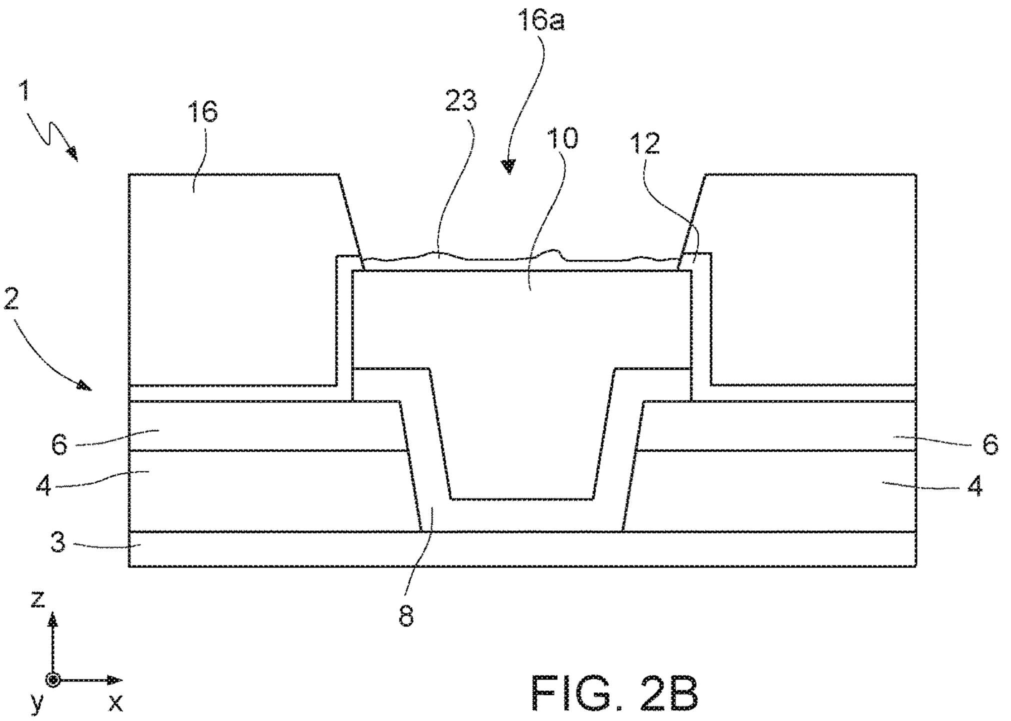
FIG. 2B (Prior Art)
Figure 2C:
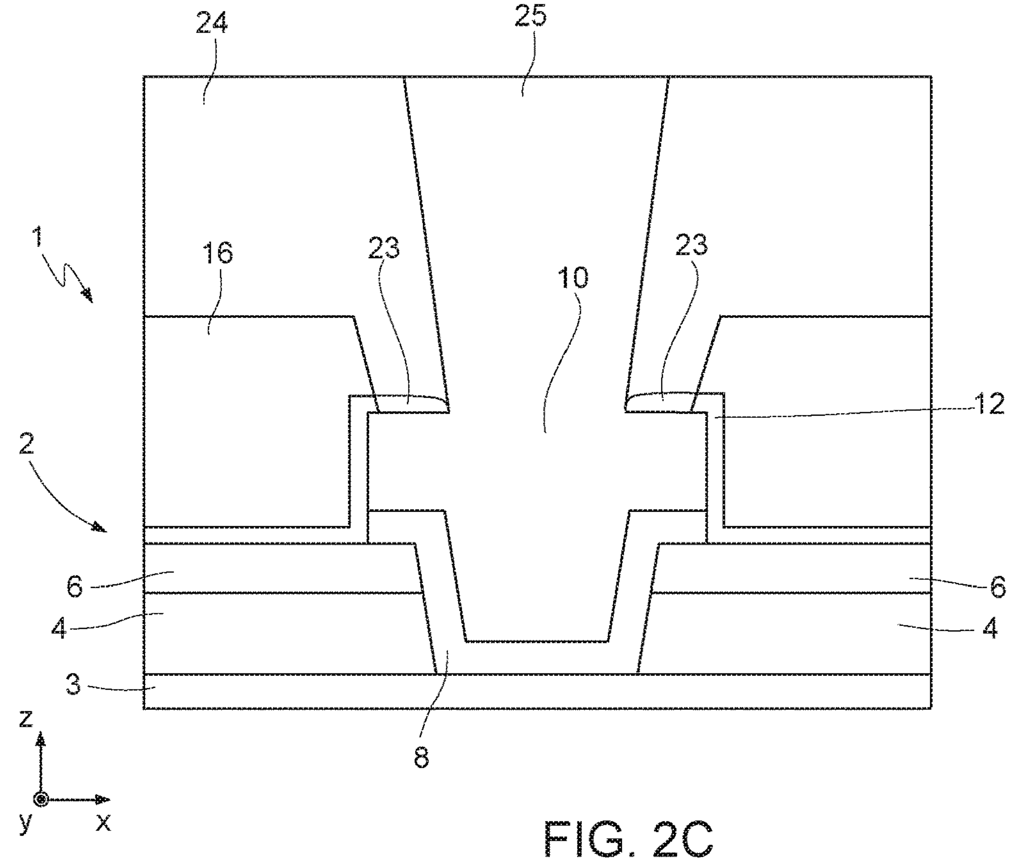
FIG. 2C (Prior Art)
Figure 3:
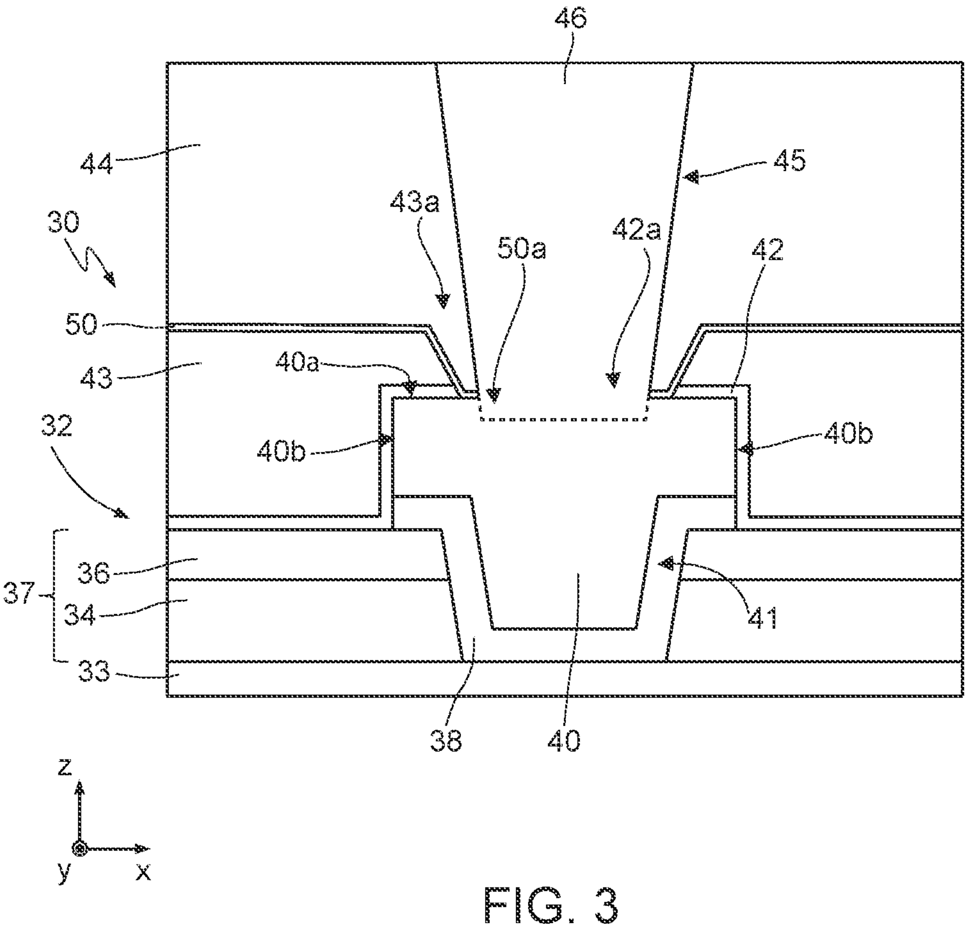
FIG. 3 is a cross-section view of a portion of an integrated circuit including a redistribution layer, according to an embodiment.

FIG. 3 shows an integrated circuit (IC) 30, only a portion of which is shown in the drawings, represented in a system of spatial coordinates defined by three axes x, y, z, orthogonal to one another and the cross-section view is taken on an xz plane, defined by the x axis and the z axis (analogously to FIG. 1 and FIGS. 2A-2C). In the following, thicknesses, depths and heights are intended as measured along the z axis, and the meanings of "top" and "bottom", "above" and "below" are defined with reference to the direction of the z axis (i.e., such terms refer to respective views on the xy plane or a plane parallel to the xy plane).

FIG. 3 shows schematically a cross-section view of a portion of the IC 30 comprising a redistribution layer 32.

The IC 30 further comprises an interconnection layer 33, made of conductive material such as aluminum or copper. In particular, the interconnection layer 33 may be the last metal line (i.e., the upper-most one) of the back end of line (BEOL) of IC 30.

The redistribution layer 32 may include a dielectric layer 34 extending above the interconnection layer 33 and a passivation layer 36 extending above the dielectric layer 34. One or more further layers (not shown) may be present between the interconnection layer 33 and the dielectric layer 34 (e.g., in case layer 33 is of Cu, a further SiN layer that protects the Cu metallization may be present between the interconnection layer 33 and the dielectric layer 34). In particular, the dielectric layer 34 is made of an insulating material, such as silicon dioxide ($SiO_2$) or a multi stack dielectric made by SiN and $SiO_2$; the passivation layer 36 is made of an insulating material, such as silicon nitride ($Si_3N_4$).

The dielectric layer 34 and the passivation layer 36 may be replaced by one single layer of insulating or dielectric material. Therefore, in the following, the term "insulating layer 37" refers either to the stack composed of the dielectric layer 34 and the passivation layer 36, or to a stack formed by more than two layers (e.g., three layers), or otherwise a single layer.

The redistribution layer 32 further comprises a barrier region 38 of conductive material. The barrier region 38 extends across the whole thickness of the insulating layer 37, so as to be in contact with the interconnection layer 33.

The redistribution layer 32 further comprises a conductive region 40, extending on top of the barrier region 38, and having a top surface 40*a* and lateral walls (or sidewalls) 40*b*. In particular, in a top view of the IC 30, not shown in the figures, the conductive region 40 is extending only inside the area defined by the barrier region 38. In the following, the term "conductive body" refers to a stack 41 including the barrier region 38 and the conductive region 40. It is noted that, according to a further embodiment, the barrier region 38 may be omitted; accordingly, in such embodiment, the term "conductive body" refers to the conductive region 40 only.

The conductive body 41 forms a conductive path from the interconnection layer 33 to the top surface of the insulating layer 37.

In one embodiment, the barrier region 38 is made of conductive material, such as titanium (Ti), or titanium-tungsten (TiW), or titanium nitride (TiN), and has thickness comprised for instance between 270 nm and 330 nm. In one embodiment, the conductive region 40 is made of conductive material, in particular metal such as copper (Cu), and has thickness comprised for instance between 8 μm and 12 μm.

The redistribution layer 32 further comprises a coating layer 42 that partially covers the conductive region 40; in particular, the coating layer 42 extends around the conductive region 40 completely covering the lateral walls 40*b* of the conductive region 40 and partially above the conductive region 40, leaving an opening 42*a* at the top surface of the conductive region 40, through which the surface 40*a* of the conductive region 40 is exposed during intermediate manufacturing steps (as better detailed later).

According to an aspect, the coating layer 42 is made of a dielectric or insulating material, in particular Silicon Nitride, for example with a thickness of about 0.5-1 μm. Other thicknesses may be chosen, according to the needs.

A further insulating layer 43, such as a photosensitive insulating layer, extends above the insulating layer 37 and above the coating layer 42. The opening 42*a* is completely contained (in top-plan view, on the xy plane) within the opening 43*a* (in one embodiment, they have the same dimension). Materials of such further insulating layer 43 include polyimide, polybenzoxazole (PBO), Epoxy, photosensitive organic material, etc.

A protection layer 50, made of a material that provides a protection of the conductive region 40 against oxidation and/or corrosion phenomena, extends on the insulating layer 43 and partially on the conductive region 40 where the conductive region 40 is not covered by the coating layer 42 (due to manufacturing steps, as better explained later).

The protection layer 50 has an opening 50*a* that coincides (in top-plan view, on the xy plane) with the opening 42*a*; the opening 50*a* is therefore completely contained (in top-plan view, on the xy plane) within the opening 43*a* of the insulating layer 43.

The protection layer 50 has a thickness in the nanometers range (i.e., lower than 100 nm). For instance, the thickness of the protection layer 50 is uniform and is between 1 nm and 100 nm, more in particular between 5 nm and 50 nm.

According to embodiments, protection layer 50 is made of an insulating or dielectric material, in particular including Aluminum or Hafnium, or is of an alloy or composite material including Aluminum and/or Hafnium. Exemplary materials are $Al_2O_3$, $HfO_2$, $Hf_iAl_jO_k$ (where j and k are freely selectable), AlN, $Al_iN_jO_k$ (where i, j and k are freely selectable), $HfN_i$ (where i is freely selectable). The protection layer 50 may also be a stack formed by a plurality of layers including Aluminum and/or Hafnium and/or their alloys or composites, such as a stack including two or more among $HfO_2/Al_2O_3/AlN/HfN_i$.

Other materials or alloys are possible, provided that they can act as protecting layers against corrosion or degradation or oxidation phenomena of the conductive region 40, and can be deposited with a thickness within the above-identified range.

The protection layer 50 has the following characteristics: good conformity, good continuity, good chemical resistance, good mechanical-electrical properties, and it is not electrically conductive (i.e., it has dielectric or insulating properties). In particular, the conformity and the continuity directly derive from the choice, better discussed later, of depositing this layer by atomic layer deposition (ALD); the chemical resistance, electrical properties and the mechanical-electrical properties are a consequence of the material chosen (as discussed above).

A molding layer 44 extends above the insulating layer 43, and the protection layer 50. The molding layer 44 has a passing hole 45 aligned with the openings 42*a*, 43*a* and 50*a*, and has (in top plan view) the same dimensions as the opening 50*a*. In intermediate steps of manufacturing, the conductive region 40 is exposed through the opening 50*a* and the passing hole 45 (as better detailed later).

A thick copper layer 46 (pillar) extends within the passing hole 45 and the opening 50*a*, reaching the top surface 40*a* of the conductive region 40 and thus providing electrical access to the conductive region 40 and to the interconnection layer 33 from the environment external to the redistribution layer 42.

As an alternative to the thick copper layer 46, wire bonding can also be used to provide electrical contact to/from the conductive region 40.

It is noted that the molding layer 44 is physically coupled to (lies on) the protection layer 50. The molding layer 44 adheres to the protection layer 50 without intermediate undesired layers or regions, and delamination or detachments issues are not present. It is noted that, in other embodiments, not explicitly shown in the drawings, further layers or regions may be present at the interface between the protection layer 50 and the molding layer 44, with the aim of improving the adherence, or for other manufacturing or electrical requirements. In any case, it is noted that according to all the embodiments, a corroded or oxidized layer like the undesired layer 23 in FIG. 2B is not present.

EWS ("Electrical Wafer Sorting") testing is normally carried out before the formation of the thick copper layer 46 (and normally before formation of the molding layer 44). In particular, according to an aspect, EWS testing is carried out at a manufacturing step when the conductive layer 40 is completely covered with, and therefore protected by, the protection layer 50.

As known, EWS testing is carried out using a contacting probe or tip of hard material, typically metal, that is configured to directly contact a conductive surface. Here, during EWS testing, the contacting probe/tip contacts the conductive layer 40. The presence of the protection layer 50 does not significantly impact the execution of EWS tests, since it is thin enough for the contacting probe/tip to "break" it or, more specifically, to pass through it without difficulties. Therefore, during EWS testing, the contacting probe/tip is directed on the protection layer 50 at the conductive layer 40 and pressed on the protection layer 50 until the contacting probe/tip penetrates through the protection layer 50 and reaches (electrically contacts) the conductive layer 40, establishing the required electrical connection for carrying out the tests. The rest of the surface of the conductive layer 40 is, during testing, protected against corrosion or oxidations phenomena that may happen during testing. High temperature testing (up and above 150° C., for example up to 200-300° C.) can be carried out without damaging or causing the formation of undesired layers on the conductive layer 40. Other reliability tests, other the EWS testing or further to EWS testing, may also be carried out at high temperatures (up to 300° C.).

FIGS. 4A-4K show schematically a cross-section view of steps of a method of manufacturing a redistribution layer according to an embodiment; in particular, the method of FIGS. 4A-4K is a method of manufacturing the redistribution layer of FIG. 3. The redistribution layer is represented in the system of spatial coordinates defined by three axes x, y, z, orthogonal to one another and the cross-section view is taken on an xz plane, defined by the x axis and the z axis.

Figure 4A:
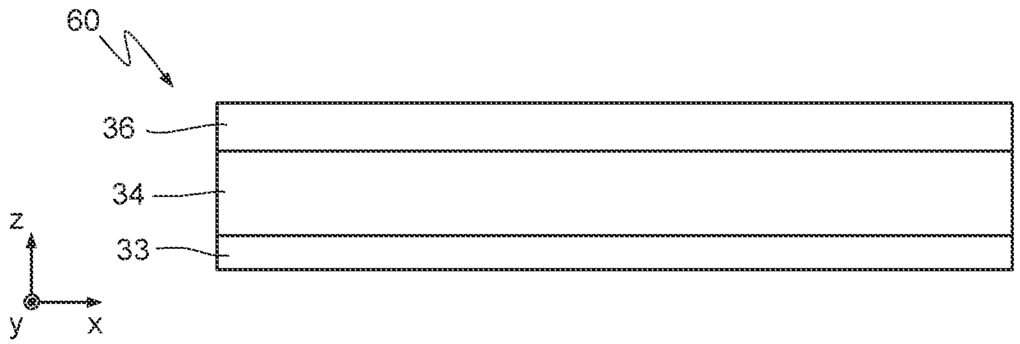
FIGS. 4A-4K are cross-section views of steps for manufacturing the redistribution layer of FIG. 3.

With reference to FIG. 4A, there is provided a wafer 60, including the interconnection layer 33. In particular, the interconnection layer 33 is the outermost (i.e., the top or upper) metallization layer of the back end of line of an integrated circuit. The lower layers of the integrated circuit below layer 33 are not shown in FIGS. 4A-4K.

The dielectric layer 34 is formed above the interconnection layer 33. In particular, the dielectric layer 34 is made of an insulating material, such as silicon dioxide ($SiO_2$), and has thickness comprised for instance between 900 nm and 1200 nm.

The passivation layer 36 is formed above the dielectric layer 34. In particular, the passivation layer 36 is made of an insulating material, such as silicon nitride ($Si_3N_4$), and has thickness comprised for instance between 500 nm and 650 nm. In the following, the term "insulating layer" refers, as already said, to the stack 37 formed by the dielectric layer 34 and the first passivation layer 36, or to a stack formed by more than two dielectric/insulating layers, or even to a single layer of insulating or dielectric or passivation material.

Figure 4B:
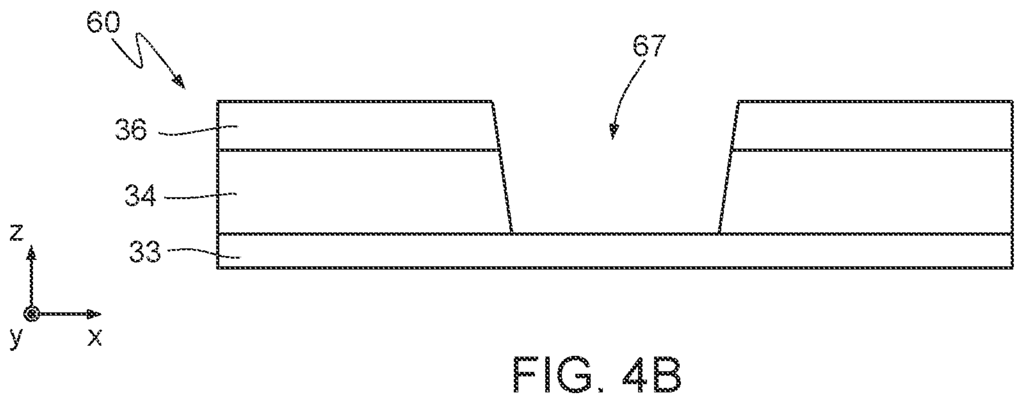

Then, in FIG. 4B, a trench, or via, 67 is formed through the passivation layer 36 and the dielectric layer 34, up to exposing a surface of the interconnection layer 33. For instance, the via 67 is formed by photolithography and dry etching steps of a known type, applied at the exposed surface of the first passivation layer 36.

Figure 4C:
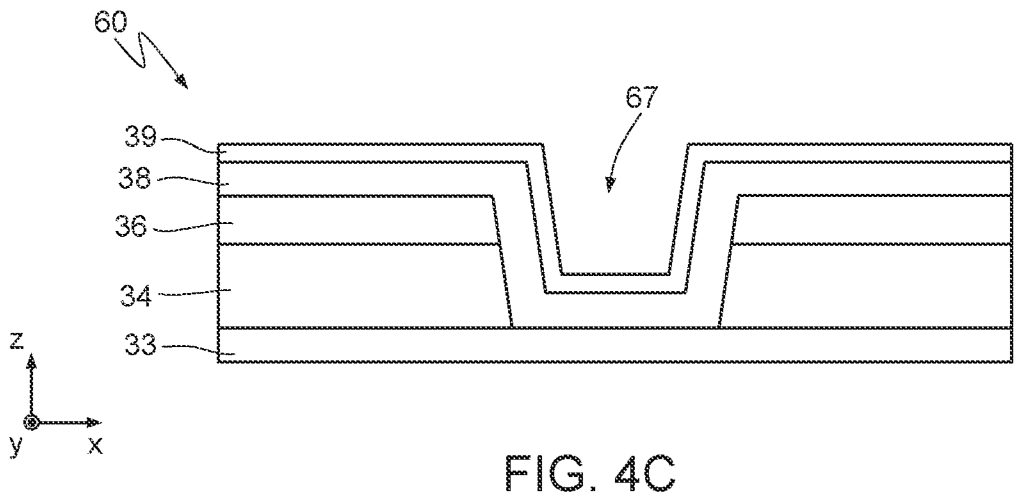

Then, in FIG. 4C, the barrier layer 38 is formed above the first passivation layer 36, for instance by physical vapor deposition (PVD). The barrier layer 38 partially fills the via 67, covering the previously exposed sidewalls of the dielectric layer 34 and the first passivation layer 36 and the previously exposed surface of the interconnection layer 33.

In particular, the barrier layer 38 is made of conductive material, such as titanium (Ti), or titanium-tungsten (TiW), or titanium nitride (TiN). Moreover, the thickness of the barrier layer 38 may be lower than the combined thickness of the dielectric layer 34 and the first passivation layer 36, and in particular is comprised for instance between 270 nm and 330 nm. Then, a seed layer 39 is formed above the barrier layer 38, partially filling the via 67. For instance, the seed layer 39 is deposited by PVD.

In particular, the seed layer 39 is made of conductive material, such as copper (Cu), and has thickness comprised for instance between 180 nm and 220 nm, such that the via 67 is only partially filled by the seed layer 39.

Figure 4D:
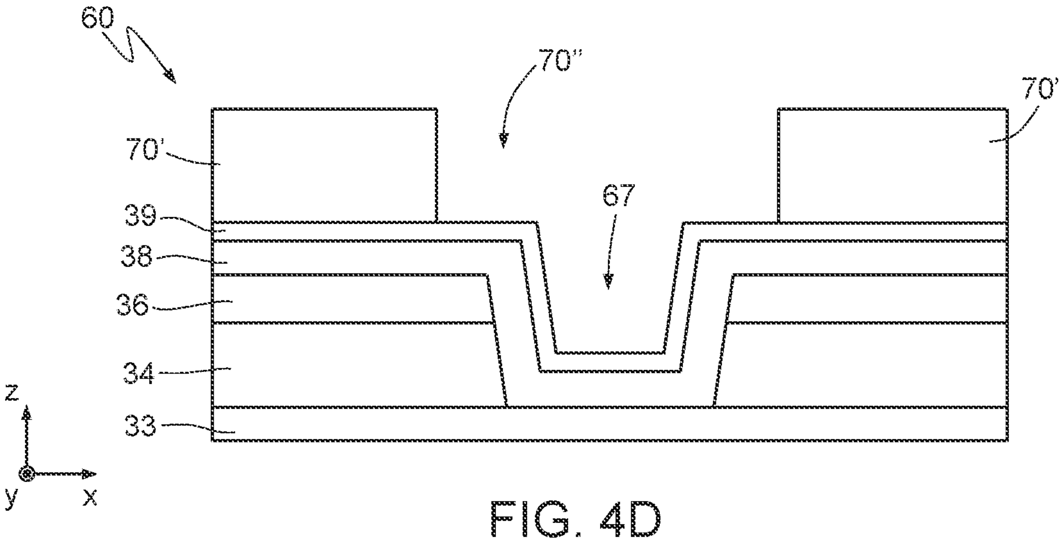

Then, in FIG. 4D, a photolithography mask 70' is applied at the exposed surface of the seed layer 39. In particular, the layout of the photolithography mask 70' is designed considering that openings in the mask define areas in which a layer will be formed in a following step of the manufacturing method.

In particular, FIG. 4D shows an opening 70" of the photolithography mask 70', the opening 70" being opened on the partially filled via 67 so that the via 67, as well as a region around the via 67, are not covered by the photolithography mask 70'.

Figure 4E:
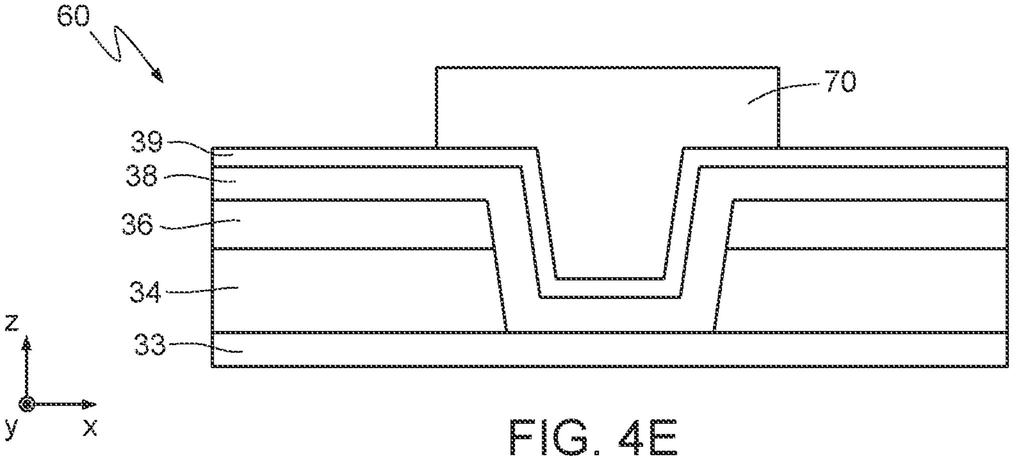

Then, in FIG. 4E, a conductive layer 70 is formed above the portions of the seed layer 39 not covered by the photolithography mask 70'. The thickness of the conductive layer 70 is high enough to completely fill the via 67 and partially fill the opening 70" of the photolithography mask 70'.

In particular, the conductive layer 70 is made of the same conductive material of the seed layer 39, such as copper (Cu), and has thickness comprised for instance between 8 μm and 12 μm.

In particular, the conductive layer 70 is formed by electrodeposition. Then, the photolithography mask 70' is removed by a wet removal process, exposing portions of the seed layer 39 not covered by the conductive layer 70.

Figure 4F:
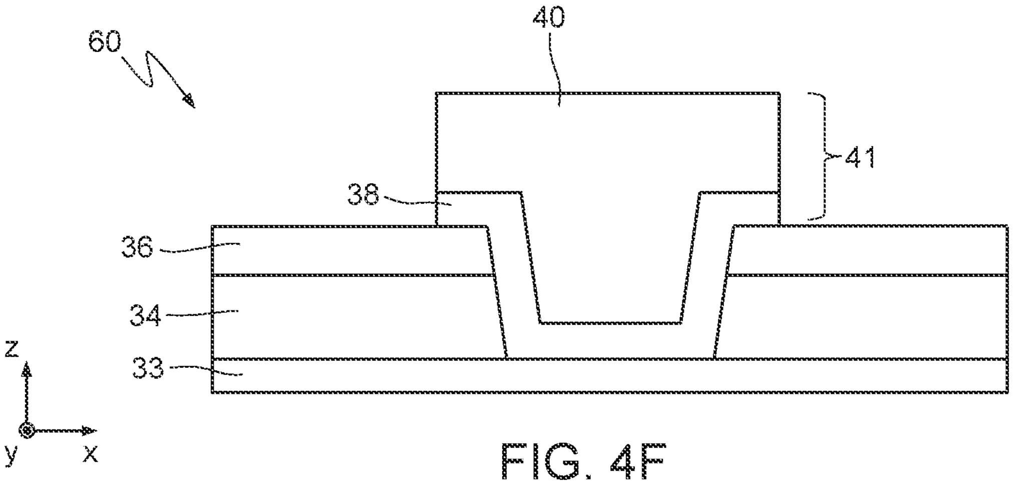

Then, in FIG. 4F, said exposed portions of the seed layer 39, not covered by the conductive layer 70, are removed, for instance by wet etching, up to exposing the portions of the barrier layer 38 underneath them. Thus, the remaining portions of the seed layer 39, covered by the conductive layer 70, form, together with the conductive layer 70, the conductive region 40 of the redistribution layer 32 of FIG. 3.

Then, the exposed portions of the barrier layer 38 are removed, for instance by wet etching, up to exposing the portions of the first passivation layer 36 underneath, without affecting the portions of the barrier layer 38 below the conductive layer 70, for instance by employing standard photolithography techniques by or directly using layer 40 as a mask for the underlying layer 38. As a consequence, the barrier layer 38 of the redistribution layer 32 of FIG. 3 is formed.

Figure 4G:
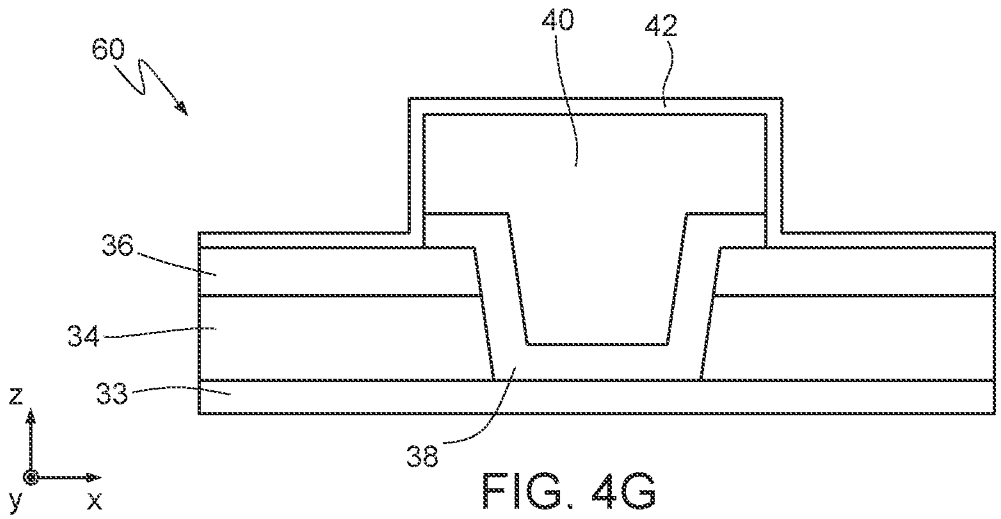

Then, in FIG. 4G, the coating layer 42 is formed on the exposed surface of the conductive layer 40 and on the barrier layer 38 exposed laterally to the conductive layer 40. The coating layer 42 is formed by depositing SiN, for example by CVD.

The coating layer 42 completely covers the conductive region 40 and the passivation region 36

Figure 4H:
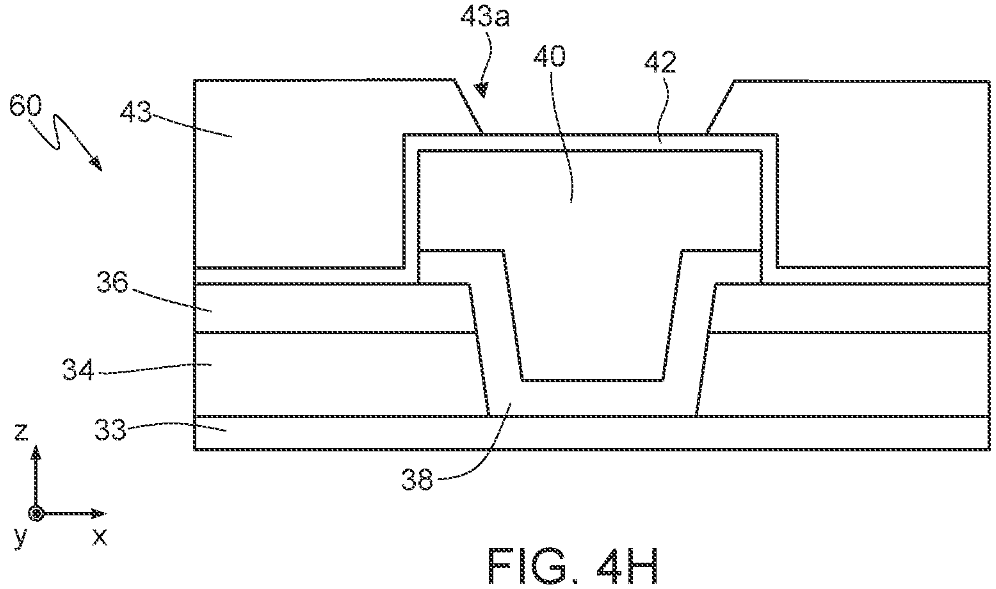

Then, in FIG. 4H, steps for forming the further insulating layer 43 are carried out. For example, the insulating layer 43 is formed by passivation with an organic photosensitive material deposited by spin coating or lamination (as examples).

The aperture 43*a* is formed through the insulating layer 43, by patterning the insulating layer 43 through photolithographic techniques, to form an access to the coating layer 42. As said above, the insulating layer 43 is a photosensitive material. Region 43*a* is formed through photolithographic patterning known per se to the one skilled in the art (e.g., exposure to suitable radiation through a photolithographic mask, followed by chemical development step that removed the photosensitive material where exposed (or not exposed, depending on resin type, which can be of a positive or negative type).

Figure 4I:
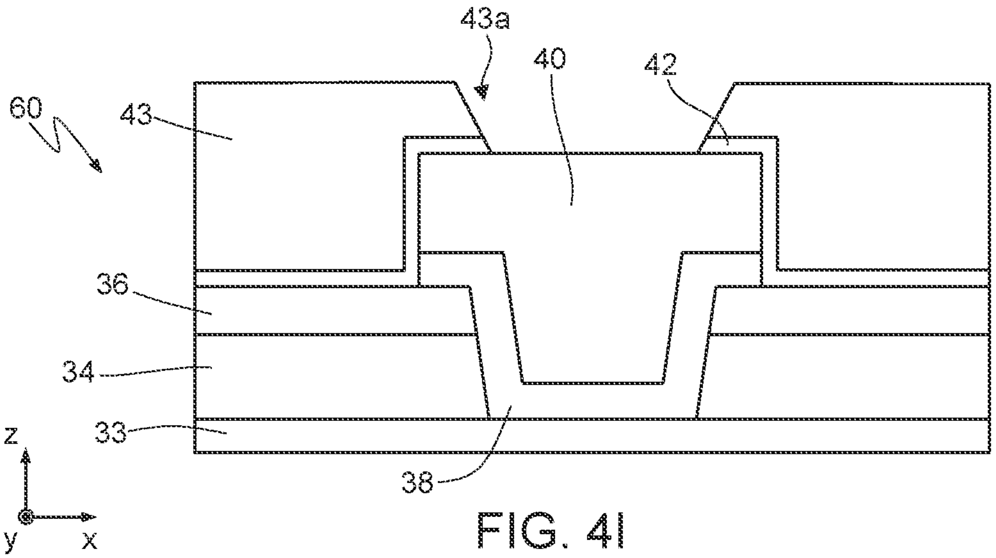

Then, in FIG. 4I, the coating layer 42 is selectively etched to remove portions of the coating layer 42 exposed through the aperture 43*a*, until the surface of the conductive layer 40 is exposed.

A native oxide can grow on the exposed surface of the conductive layer 40. A cleaning step can be carried out to remove the native oxide, for example using a chemistry based on HF.

Figure 4J:
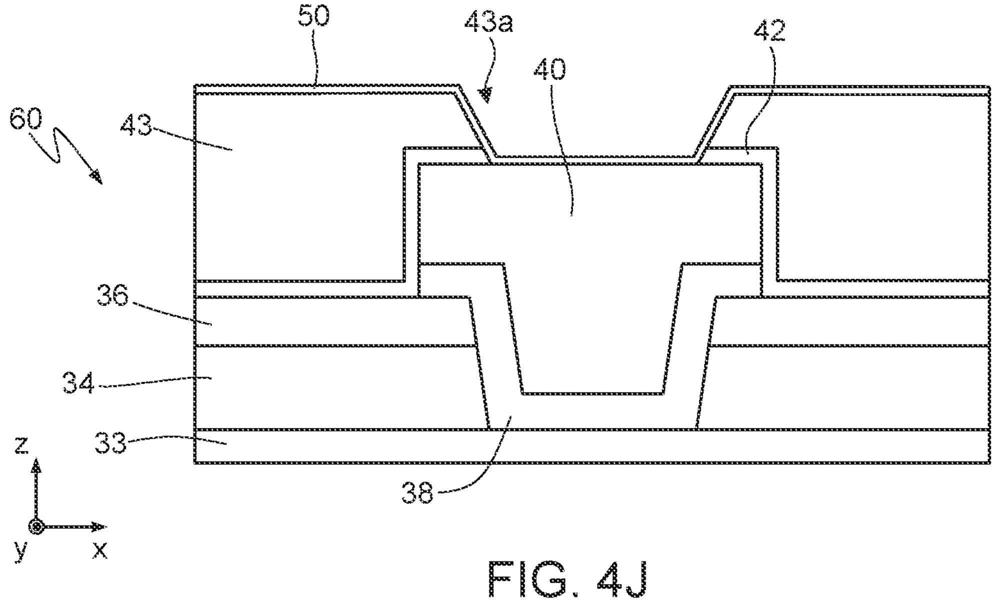

With reference to FIG. 4J, the protection layer 50 is formed (deposited) by atomic layer deposition (ALD) of an alloy or compound including Aluminum or Hafnium. In general, the protection layer 50 may be one of: an oxide of Aluminum or Hafnium; a nitride of Aluminum; a compound such as $Hf_xAl_yO_z$; a multiplayer including a plurality of sub-layers different from one another, each sub-layer being of one among the above-cited materials.

The protection layer 50 completely and uniformly covers the conductive region 40 (where exposed through aperture 43*a*) as well as the insulating layer 43.

Plasma-assisted ALD or thermal ALD can be used interchangeably to form the protection layer 50.

The process for forming the protection layer 50 includes the following parameters: temperature range during deposition, for plasma-assisted ALD: 20-300° C.; temperature range during deposition, for thermal ALD: 150-500° C.; type of precursors used (at least one among): TMA, $H_2O$, $HfCl_4$, $O_3$+TEMAHf, $N_2H_4$, $NH_3$; typically, two precursors are used together, such as $H_2O$+TMA to obtain $Al_2O_3$, or $HfCl_4$+$H_2O$ to obtain $HfO_2$; pressure range during deposition, for plasma-assisted ALD: equal to or less than 1 Torr; and pressure range during deposition, for thermal ALD: from 1 mTorr to 20 Torr.

The protection layer 50 thus formed has the following properties: density (@ 20° C.) in the range 2-11 g/$cm_3$; and refractive index (at 550 nm-633 nm wavelength) in the range 1.6-2.3.

Another process for forming the protection layer 50 (which can be applied in the context of the embodiment of FIG. 3) includes carry out a PECVD deposition of a thin layer (i.e., under 100 nm, for example between 10 nm and 100 nm) of a dielectric or insulating material, such as silicon carbon nitride (SiCN).

After the steps of FIG. 4J, the EWS test, or any other electrical test, can be carried out, as already described, since the protection layer 50 is directly accessible by the testing probe. As already discussed, the probe penetrates through the protection layer 50 to reach the conductive region 40 to carry out the EWS test without leaving portions of the conductive region 40 exposed to the test environment. More precisely, only a small area of the conductive region (where the protection layer has been broken/opened by the probe tip) is left exposed to the test environment, and this only after the EWS has been carried out. This drastically reduces the risk of potential corrosion issues and their consequences on EWS test reliability and molding material delamination.

Figure 4K:
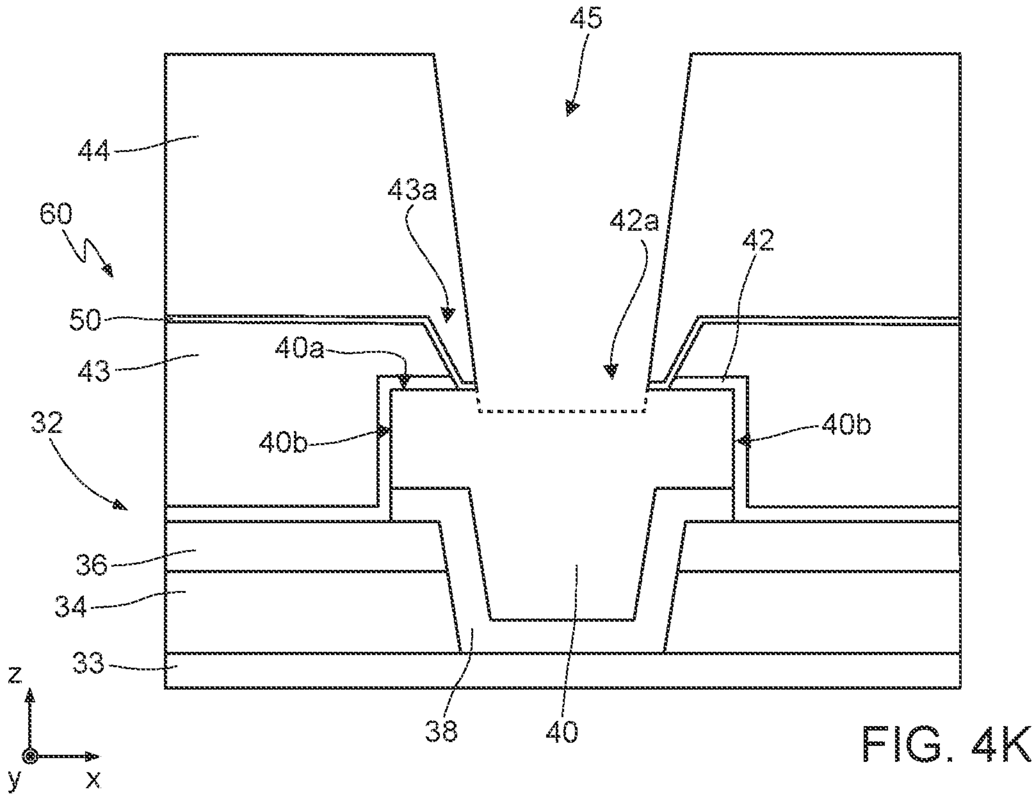

Then, FIG. 4K, a packaging process is carried out, using a molding material such as a polymeric material deposited by injection molding, or formed by transfer molding or top gate molding, or other techniques known in the art (thus forming the molding layer 44). The molding layer 44 is formed (e.g., deposited) above the insulating layer 43 and in particular on the protection layer 50. A laser drilling, or other patterning technique, is then carried out to selectively remove portions of the molding layer 44 and layer 50, to form the opening 45. It is noted that the molding layer 44 is physically coupled to the protection layer 50. Other embodiments are possible, where one or more intermediate layers between the protection layer 50 and the molding layer 44 are present.

The steps for forming the molding layer 44 are carried out during the back-end process. Selective portions of the molding layer 44 are then removed (for example by a LiSI—"Laser Induced Strip Interconnect"—process step), thereby forming the passing hole 45.

A step of forming a conductive connection region 46, in the form of pillar (analogously to the pillar 25 of FIG. 1), is then carried out. If the conductive region 40 is of metal (such as Copper), the conductive connection region 46 can be formed by electroplating metal (Copper) material, filling the apertures 42*a*, 43*a* and the passing hole 45 with such metal (Copper). The conductive connection region 46 thus formed is in electrical contact with the conductive region 40 and, through the conductive region 40, with the interconnection layer 33. The integrated circuit 30 of FIG. 3 is thus formed.

The described process is one of the possible alternatives to form Copper Direct Interconnect (that is, providing electrical connection between die and package without resorting to wire bonding). Alternatives may foresee the use of materials different from the molding for packaging, and techniques different for LiSI, such as an aEASI process. Moreover, alternatively to the step of forming a conductive connection region 46 in the form of pillar, a wire bonding can be implemented, as apparent to the skilled person in the art. In case of wire bonding, the layer 44 is formed afterwards and partially covers the wire.

Figure 5:
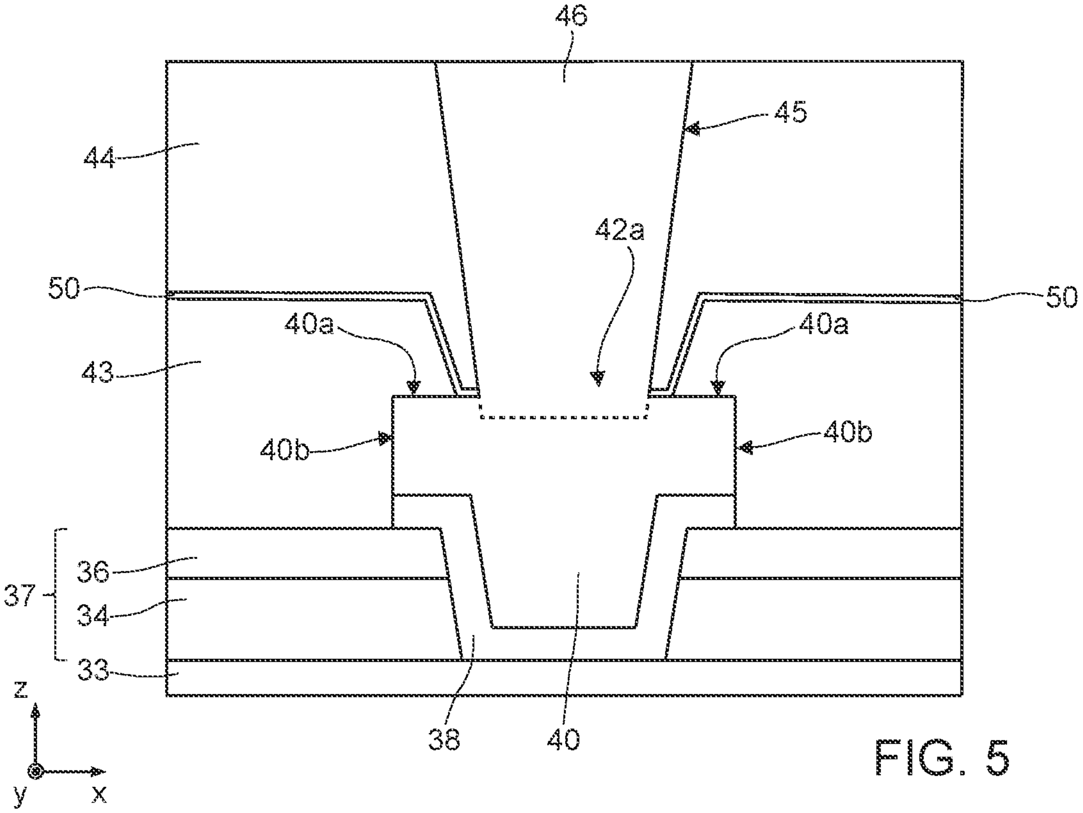
FIGS. 5 and 6 are cross-section views of a respective portion of an integrated circuit including a redistribution layer, according to respective further embodiments.

FIG. 5 shows a further embodiment of a redistribution layer, where features/elements common to those of FIG. 3 are identified using the same reference numerals and not further described.

The redistribution layer of FIG. 5 differs from the redistribution layer 32 in that the coating layer 42 is not present. In this case, the insulating layer 43 is formed on the insulating layer 37 and on the conductive layer 40 (on part of the top surface 40*a* and on the sidewalls 40*b*).

Figure 6:
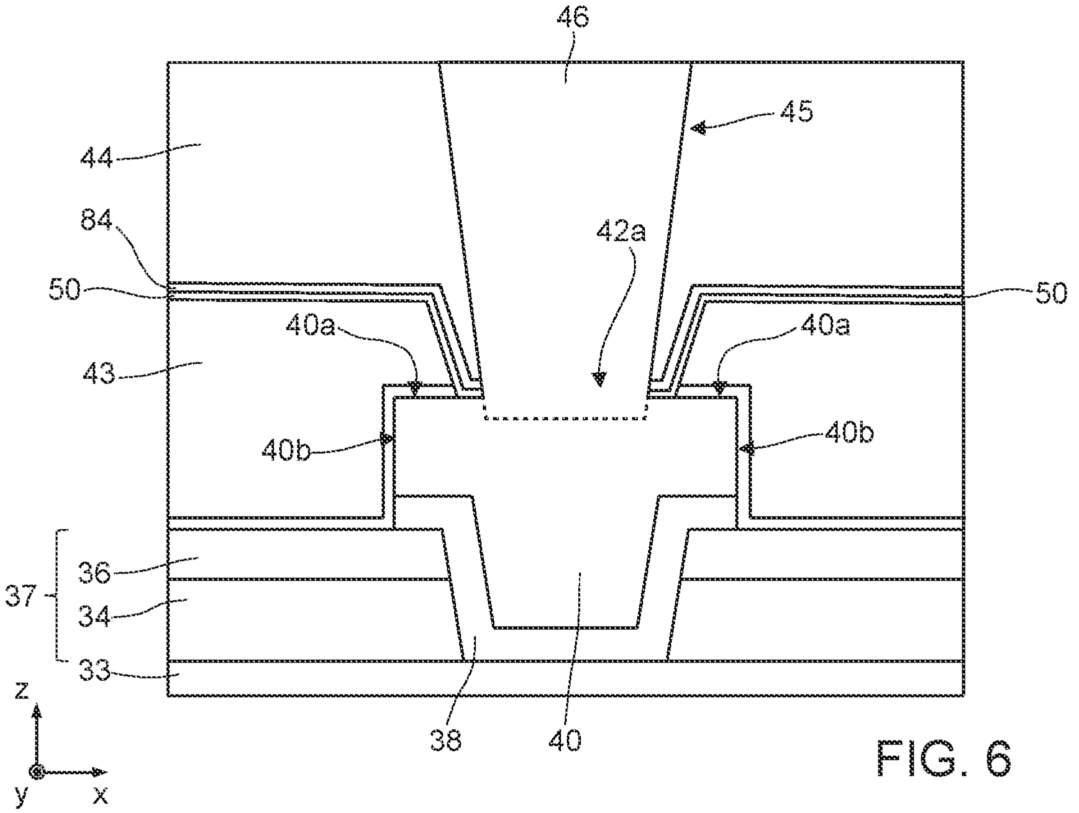

FIG. 6 shows a further embodiment of a redistribution layer, where features/elements common to those of FIG. 3 are identified using the same reference numerals and not further described.

The redistribution layer of FIG. 6 differs from the redistribution layer 32 in that it further comprises a second protection layer 84 that covers the protection layer 50. The second protection layer 84 extends on the protection layer 50, in direct contact with the protection layer 50. The second protection layer 84 has an opening 84*a* which matches, in terms of shape and dimension, the opening 50*a* of the protection layer 50, or that is larger than the opening 50*a*, so that, in top plan-view, the opening 50*a* is completely contained within the opening 84*a*.

The second protection layer 84 is made of a material having a low thermal expansion coefficient in the range $0.5 \cdot \times 10^{-6}$-$6.0 \times \neq 10^{-6}$ 1/K, to provide a further protection to the conductive region 40 during high-temperature EWS testing. In particular, the second protection layer 84 provides a further protection against corrosion/oxidation/degradation of the conductive region 40 in case, during high-temperatures EWS processes, the protection layer 50 locally breaks or cracks.

Exemplary materials that can be used for the second protection layer 84 are insulators or dielectrics, such as Silicon Nitrides (e.g., $Si_3N_4$), Silicon Carbon Nitrides (SiCN), Silicon Oxides (e.g., $SiO_2$), Silicon Oxycarbides (SiOC). The second protection layer 84 can also be formed as a stack including one or more of the above-listed materials.

The second protection layer 84 has a thickness in the range 0.01 μm-1 μm (for example, between 0.1 μm and 1 μm).

In general, the material of the second protection layer 84 is chosen such that it can sustain high temperatures (up to 300° C.) during high-temperature testing (such as EWS tests) without damages. In particular, such damages include cracking, fractures, etc., which may cause electromigration phenomena, electrochemical migrations, etc.

The process steps for manufacturing the embodiment of FIG. 6 substantially conform with that already described with reference to wafer 60, with the further steps of forming the second protection layer 84 on the protection layer 50.

The advantages of the structures and processes described previously, according to the various embodiments, emerge clearly from the foregoing description.

In particular, the protection layer 50 is considerably thin and can be deposited by ALD with a highly controlled thickness, and good conformity. Is also provides a good diffusion barrier for the underlying Copper region 40 (it acts as a corrosion migration barrier); it further enables EWS testing without the need for a preliminary etching step, thus preserving the thermomechanical stability.

Further advantages include cost saving, due to a simpler manufacturing process than the prior art; improved oxidation protection during taping and reduced delamination in case of BSM (back side metal) needs; no risk of unstable EWS test at high temperatures; no risk of contamination of the photosensitive insulating layer 43 during front-end processes and reduced contamination risk during EWS; no risk of contamination of the conductive layer 40 during front-end (FE) processes and reduced contamination risk during EWS; low risk of corrosion when the device is stored in an uncontrolled environment before during/after EWS and shipment; low risk of corrosion of the conductive layer 40 during back grinding (tape contamination) and around pad opening (during LiSI or, generally, during direct Cu interconnect assembly).

Finally, it is clear that modifications and variations may be made to what has been described and illustrated herein, without thereby departing from the scope of the present invention, as defined in the annexed claims.

For example, insulating layers 37 and 43 may be of a same material, so that at the end of manufacturing they result in a single insulating region or insulating layer.

In particular, even though the advantages and specific application of the present invention has been discussed with explicit reference to EWS testing, the present invention is advantageous, and can be used, to protect the conductive layer 40 from corrosion/oxidation phenomena during all phases of the FE (front-end) and BE (back-end) process flow (and between FE and BE), guaranteeing at the same time the electrical testability without degradation or pad probe instability (in particular during EWS/PT carried out between FE and BE phases).

The invention claimed is:

1. A method of manufacturing a redistribution layer for an integrated circuit, comprising the steps of:

forming a first insulating layer on a conductive interconnection layer of a wafer;

forming a conductive body in electrical contact with the conductive interconnection layer;

covering the conductive body with an insulating region having an aperture that exposes a surface of the conductive body;

covering the surface of the conductive body and the insulating region with an insulating dielectric protection layer having a thickness less than 100 nm and configured to provide a protection against one or more of oxidation and corrosion of the conductive body.

2. The method of claim 1, wherein the step of forming the insulating dielectric protection layer comprises performing a material deposition selected from the group consisting of: an atomic layer deposition, a thermal atomic layer deposition, a plasma-assisted atomic layer deposition, a chemical vapor deposition, and a plasma-enhanced chemical vapor deposition.

3. The method of claim 1, wherein the insulating dielectric protection layer is made of a dielectric oxide material including Aluminum or Hafnium or a dielectric nitride material including Aluminum.

4. The method of claim 3, further comprising the steps of:

locally perforating the insulating dielectric protection layer with a testing probe or testing tip until the conductive body is electrically contacted by the testing probe or testing tip; and carrying out an electrical test of the integrated circuit using the testing probe or testing tip.

5. The method of claim 4, further comprising, after having locally perforated the insulating dielectric protection layer, the steps of:

forming a molding layer on the insulating protection layer;

forming a first passing hole extending through the molding layer until a surface portion of the insulating dielectric protection layer is exposed;

forming a second passing hole extending through the insulating dielectric protection layer until the surface of the conductive body is exposed; and electrically contacting the conductive body through the first passing hole and the second passing hole.

6. The method of claim 5, wherein electrically contacting the conductive body includes one of: forming a conductive pillar within the first passing hole and the second passing hole which is in electrical contact with the conductive body; or carrying out a wire bonding operation on the exposed surface of the conductive body.

7. The method of claim 1, further comprising the step of covering the insulating dielectric protection layer with a further protection layer configured to sustain temperatures up to 300° C. without damages.

8. The method of claim 7, wherein the further protection layer has a coefficient of thermal expansion in a range of $0.5\times10^{6}$ to $6.0\times10^{-6}$ 1/K.

9. The method of claim 7, wherein the further protection layer is made of a dielectric or insulating material selected from the group consisting of: a Silicon Nitride, a Silicon Carbon Nitride, a Silicon Oxycarbide, a Silicon Oxide.

10. The method of claim 7, wherein the further protection layer has a thickness in a range of 0.01 μm to 1 μm.

11. The method of claim 7, further comprising the steps of:

removing selective portions of the further protection layer;

locally perforating the insulating dielectric protection layer with a testing probe or testing tip until the conductive body is electrically contacted by the testing probe or testing tip; and carrying out an electrical test of the integrated circuit using the testing probe or testing tip.

12. The method of claim 1, wherein forming the insulating region includes forming a coating layer made of Silicon Nitride that completely covers the conductive body.

13. The method of claim 12, wherein forming the insulating region further includes forming a photosensitive insulating layer on the coating layer.

14. The method of claim 13, wherein the photosensitive insulating layer is made of a material selected from the group consisting of: polyimide, polybenzoxazole (PBO), Epoxy, and photosensitive organic material.

15. The method of claim 1, wherein forming the insulating region includes forming a photosensitive insulating layer that completely covers the conductive body.

16. The method of claim 15, wherein the photosensitive insulating layer is made of a material selected from the group consisting of: polyimide, polybenzoxazole (PBO), Epoxy, and photosensitive organic material.

17. A method, comprising:

manufacturing a redistribution layer for an integrated circuit in accordance with claim 1;

forming a molding layer on the protection layer;

forming a first passing hole extending through the molding layer until a surface portion of the protection layer is exposed;

forming a second passing hole extending through the protection layer until the surface of the conductive body is exposed; and electrically contacting the conductive body through the first passing hole and the second passing hole.

18. The method of claim 17, wherein electrically contacting the conductive body includes one of: forming a conductive pillar within the first passing hole and the second passing hole, in electrical contact with the conductive body; or carry out a wire bonding operation on the exposed surface of the conductive body.

* * * * *